United States Patent [19]

Van Etten et al.

[11] 4,034,363
[45] July 5, 1977

[54] REAL TIME DATA RATE QUANTIZER AND ANALOG-TO-DIGITAL CONVERTER SYSTEM

[75] Inventors: Paul Van Etten, Clinton; John V. McNamara, Rome, both of N.Y.

[73] Assignee: The United States of America as represented by the Secretary of the Air Force, Washington, D.C.

[22] Filed: Jan. 14, 1976

[21] Appl. No.: 649,106

[52] U.S. Cl. .............................. 340/347 P; 315/8.5
[51] Int. Cl.² .................................... H03K 13/00
[58] Field of Search .................. 340/347 M, 347 P; 315/8.5

[56] References Cited

UNITED STATES PATENTS

| | | | |
|---|---|---|---|
| 2,512,655 | 6/1950 | Kohler | 340/347 M |
| 2,650,299 | 8/1953 | Peterson | 315/8.5 |
| 2,901,663 | 8/1959 | Nevius | 340/347 M |
| 3,265,902 | 8/1966 | Wingate | 340/347 M |
| 3,400,391 | 9/1968 | Rantsch | 340/347 M |
| 3,416,152 | 12/1968 | Trilling | 340/347 M |
| 3,441,350 | 4/1969 | Rantsch | 340/347 M |

*Primary Examiner*—Charles D. Miller
*Attorney, Agent, or Firm*—Joseph E. Rusz; George Fine

[57] ABSTRACT

A real time data rate quantizer and analog-to-digital converter system employs an electron beam which is deflected by an analog input waveform. The deflected electron beam strikes a mosaic target in which electron beam sensitive elements detect and quantize the signal. The outputs of the detectors feed an encoder resulting in a binary digital output waveform.

3 Claims, 11 Drawing Figures

REAL TIME DATA RATE QUANTIZER AND ANALOG-TO-DIGITAL CONVERTER SYSTEM

STATEMENT OF GOVERNMENT INTEREST

The invention described herein may be manufactured and used by or for the Government for governmental purposes without the payment of any royalty thereon.

BACKGROUND OF THE INVENTION

The system of the present invention performs quantization or analog-to-digital (A/D) conversion of an analog waveform. Of importance is that the system works in real time (e.g., continuous) and operates with analog input signals with over one gigahertz bandwidth. The system accepts both unipolar and bipolar video waveforms. Further, the system includes parallel output channels such that further circuitry to be employed with the system operates with reduced bandwidth. For N output channels the effective bandwidth of each channel is reduced to 1/N times the bandwidth of the input signal.

The system has multiple utility when quantization or A/D conversion is required, i.e., for communication systems, radars, and systems in general which employ digital computers from analog inputs.

SUMMARY OF THE INVENTION

A real time large data rate quantizer and A/D converter system is provided. The system includes an electron gun, deflector structure, mosaic beam sensitive target and an output circuit. The electron gun produces an electron beam of constant energy; i.e., the beam is not amplitude modulated. The electron beam passes through the deflection structure and impinges on the mosaic target from which output signals are derived and are further processed in digital output In operation the deflection structure and circuitry produces a rotating beam such that the beam impinges on the target in a circular pattern. As the input analog waveform is increased in magnitude, the diameter of the circular pattern on the target is increased appropriately. An important feature of the invention resides in the use of an electron beam directed to strike a mosaic target and the beam taking a path according to deflections introduced by an analog input signal so that, as the electron beam is deflected it quantizes the analog signal. The electron beam current output from the mosaic is sent to an encoder which encodes the quantized amplitude to a binary format.

DETAILED DESCRIPTION OF THE PREFERRED EMBODIMENT

Figure 1:
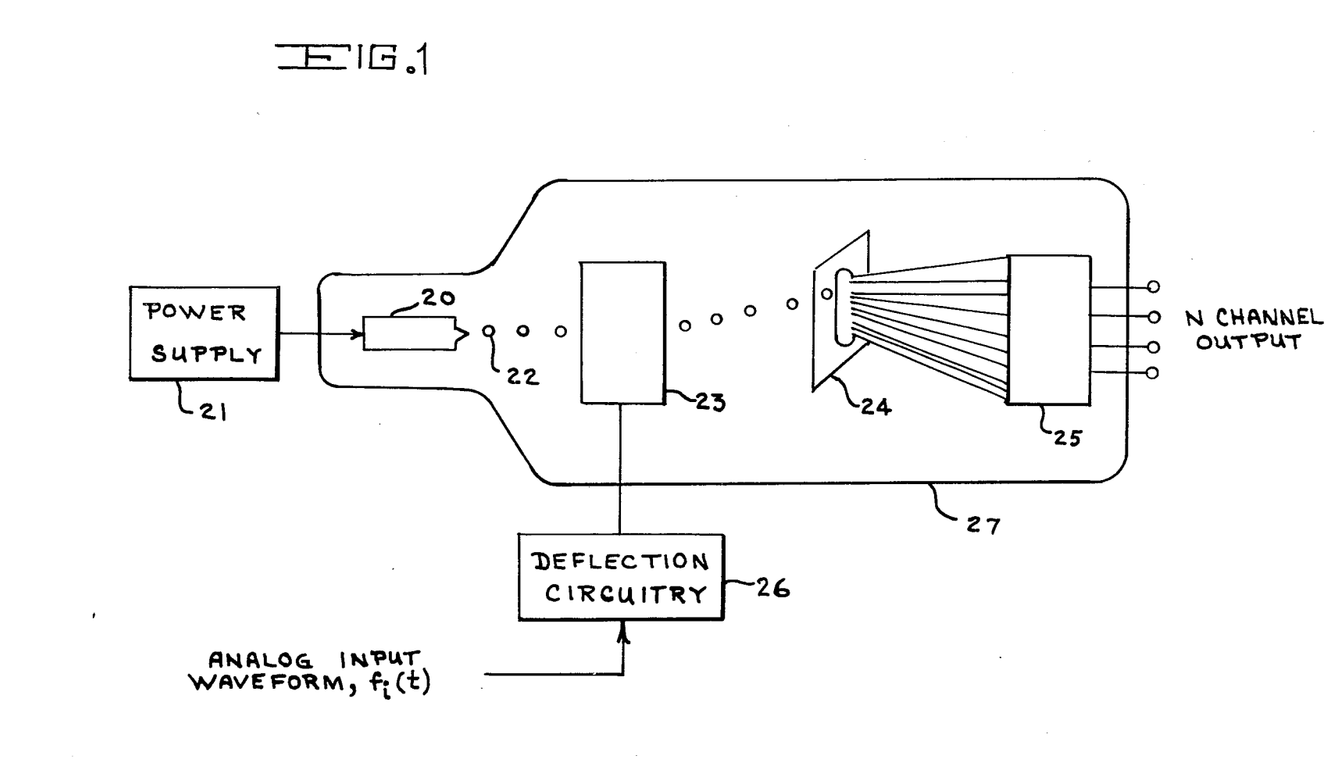
FIG. 1 shows in block diagram form the real time large data rate quantizer employed as an A/D converter.

Referring in detail to FIG. 1, there is shown the block diagram of the real time large data rate quantizer and analog to digital converter. There is illustrated conventional electron gun 20 having power supply 21. Electron beam 22 is emitted from electron gun 20 and is directed through deflection structure 23 to impinge upon mosaic electron beam sensitive target 24 resulting in an output to encoder 25 providing parallel outputs. Deflection structure 23 receives operative signals from deflection circuitry 26. Deflection circuitry 26 receives an analog input waveform. Deflection structure 23 and deflection circuitry 26 will be discussed in greater detail hereinafter in relation to FIG. 2.

Electron gun 20 produces an electron beam with a typical energy of 10,000 electron volts and a spot size on mosaic target 24 of the order of 1 mil diameter. Electron beam 22 is of constant energy; i.e., the beam is not amplitude modulated. Electron gun 20, deflection structure 23, mosaic target 24, and encoder 25 are enclosed in vacuum envelope 27 (glass or metal), using technology common and conventional to electron beam devices. The physical appearance, for example, may be that of a conventional cathode-ray tube with the appropriate electrode leads therethrough and with the mosaic target and decoder positioned thereon by conventional insulating supportive structure. The electron gun is conventional and within the present state-of-the-art. Electron beam 22 formed by electron gun 20 is of constant intensity and is passed through deflection structure 23. Various forms of deflection structures such as conventional magnetic or electrostatic deflection can be employed to deflect the electron beam. One of many deflection techniques can be employed. However, a simple electrostatic deflection structure is utilized herein.

In operation, deflection structure 23 and deflection circuitry 26 produce a rotating beam such that the beam impinges on mosaic target 24 in a circular pattern. As the input wave-form is increased in magnitude, the diameter of the circular pattern on the mosaic target is increased appropriately.

Figure 2:
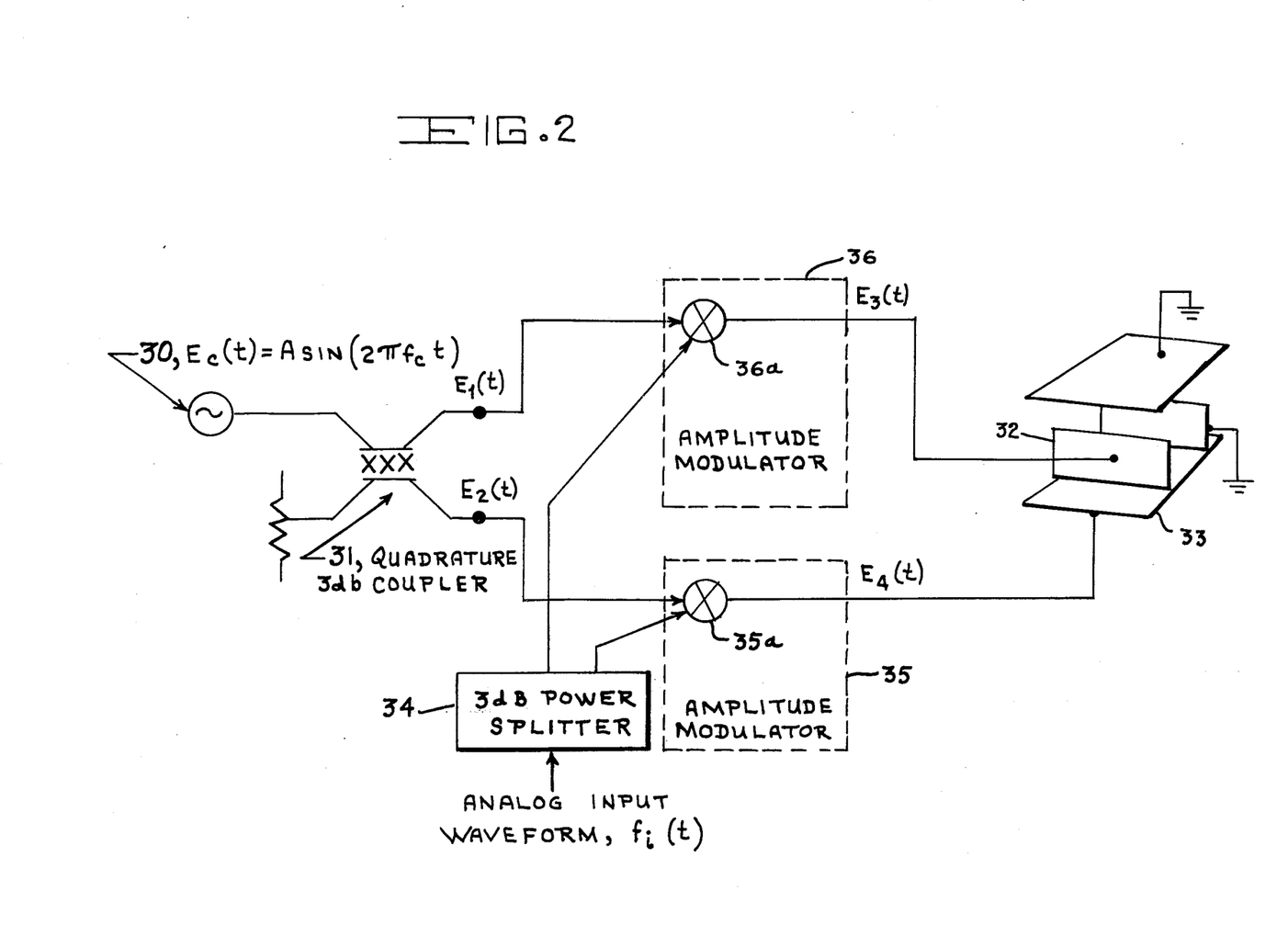
FIG. 2 illustrates the deflection circuitry utilized in FIG. 1.

A typical deflection circuit and structure is detailed with reference to FIG. 2. Deflection oscillator 30 of frequency $f_c$ feeds 3 db coupler 31 such that the two outputs are 90° out of phase. If the deflection oscillator is a sinusoid with output $E_c = A \sin Wt$, then the two outputs of the coupler are $E_1 = \sqrt{2} A \sin Wt$ and $E_2 = \sqrt{2} A \cos Wt$. If $E_1$ feeds horizontal deflection plates 32 and $E_2$ feeds vertical deflection plates 33 the electron beam rotates, producing a circular pattern of the target (say, in a clockwise direction). By reversing the inputs (i.e., $E_1$ and $E_2$) the electron beam can be made to rotate in the opposite or counter clockwise direction.

Figure 3:
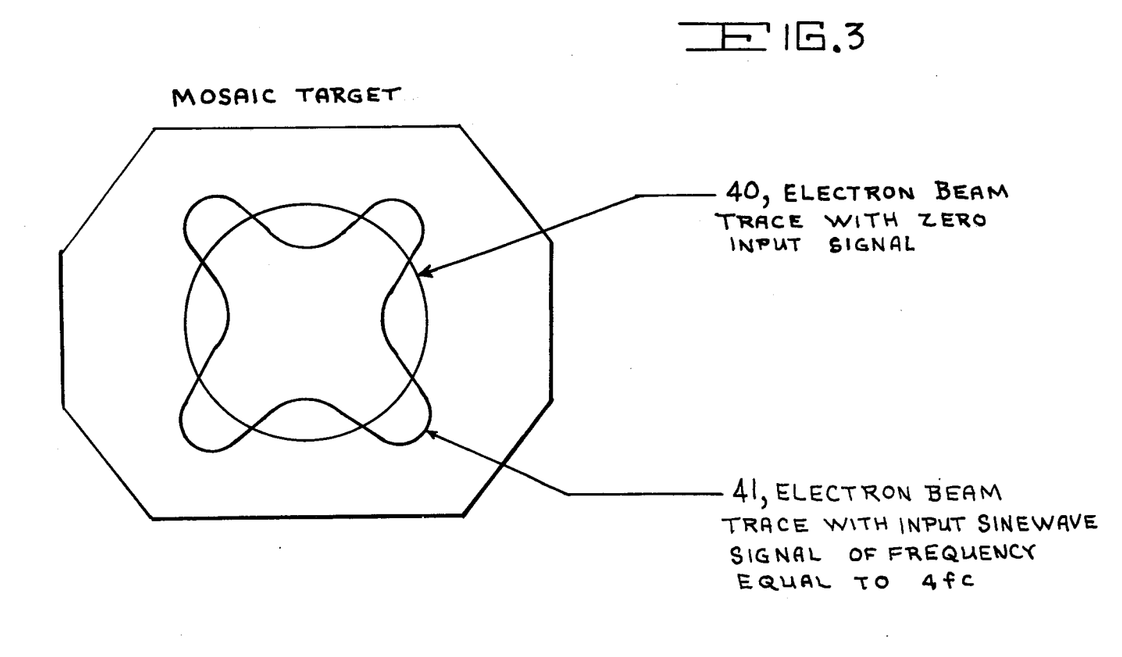
FIG. 3 shows the electron beam trace on the mosaic target of FIG. 1.

The quadrature signals described above are amplitude modulated by the analog input signal, $f_i$. Two equal amplitude equal phase signals are derived from $f_i$ by simple power splitter 34 and drive a modulator for each of the quadrature signals. Typical amplitude modulators 35 and 36, such as that shown in FIG. 2, are simple mixers 35a and 36a. Other amplitude modulators may be employed whereas the one shown is used merely as an example. The output of the amplitude modulators ($E_3$ and $E_4$) are $E_3 = Kf_i(t) \sin(2\pi f_c t)$ and $E_4 = Kf_i(t) \cos(2\pi f_c t)$ where the factor $K$ includes the signal loss of the amplitude modulators. The trace of the electron beam on the target is seen in FIG. 3. With a zero input signal trace 40 of the electron beam is a circle where the radius is adjusted by setting the output level of the deflection oscillator shown in FIG. 3. Also shown, for example, is electron beam trace 41 of a sine waveform input with a frequency of four times that of the deflection oscillator.

Figure 4:
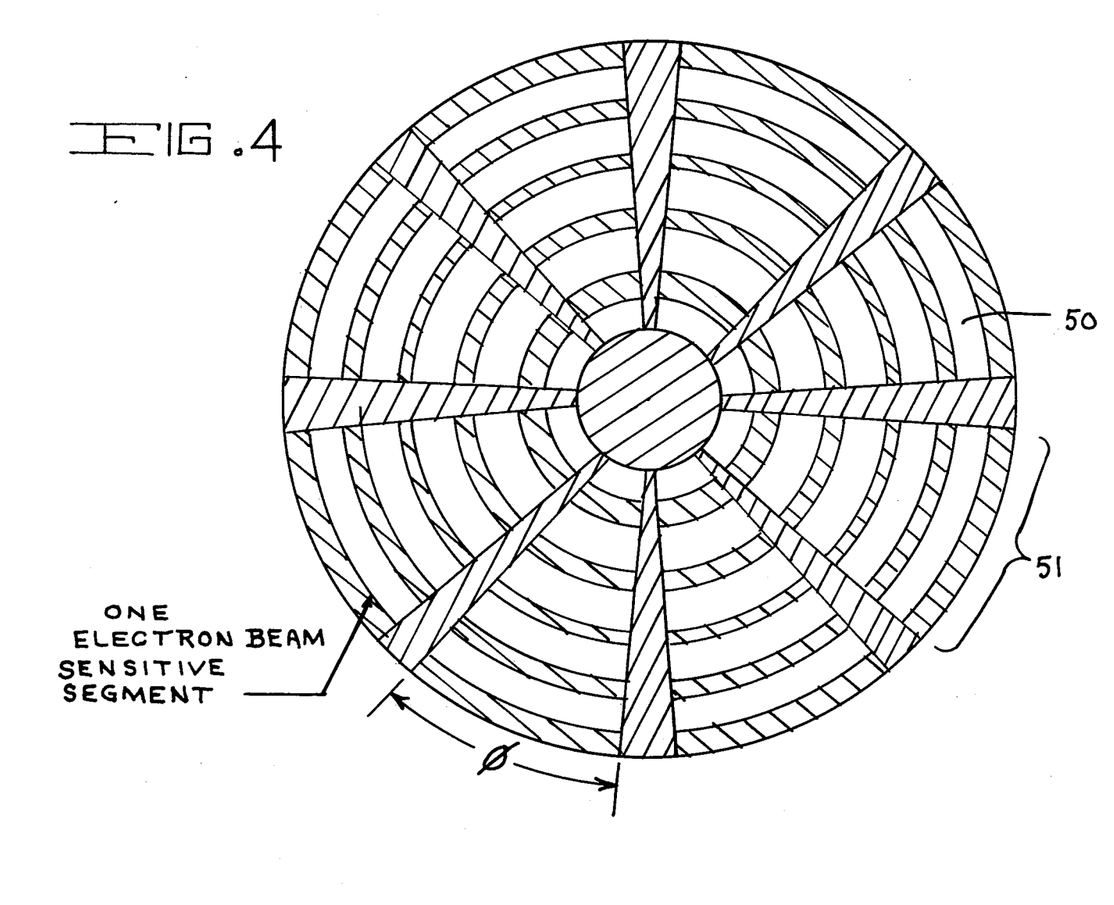
FIG. 4 shows the mosaic target comprised of electron beam sensitive devices.

The target consists of a mosaic of electron beam sensitive detectors arranged in annular rings as ring 50 with angular symmetry as shown in FIG. 4. Each wedge shaped piece is called a sector, as sector 51. The number of sectors required for Nyquist sampling is $$N \geq 2 \frac{f_{max}}{f_c} \quad (1)$$

where
- $N$ = No. of sectors
- $f_{max}$ = maximum frequency component of the analog input signal, and
- $f_c$ = deflection oscillator frequency.

For an $n$-bit A to D converter, each sector will consist of $2^n$ segments each being a separate electron beam sensitive device. Such a device will make a $2^n$ level quantizer. The radial dimension of the segments in each sector can be varied to allow for nonlinearities in the deflection system or to intentionally cause nonlinear A-D conversion or quantization.

Since the electron beam is rotating at an angular frequency $\omega_c$, the time, $\tau_1$, for the beam to move across a sector of angular dimension $\theta$ (FIG. 4) is $$\tau_1 = \frac{\theta}{\omega_c} \text{ seconds/sector} \quad (2)$$

The number of electrons which impinge on each sector in time $\tau_1$ is, $I_b \times \tau_1$, where $I_b$ is the current in the electron beam.

Figure 5:
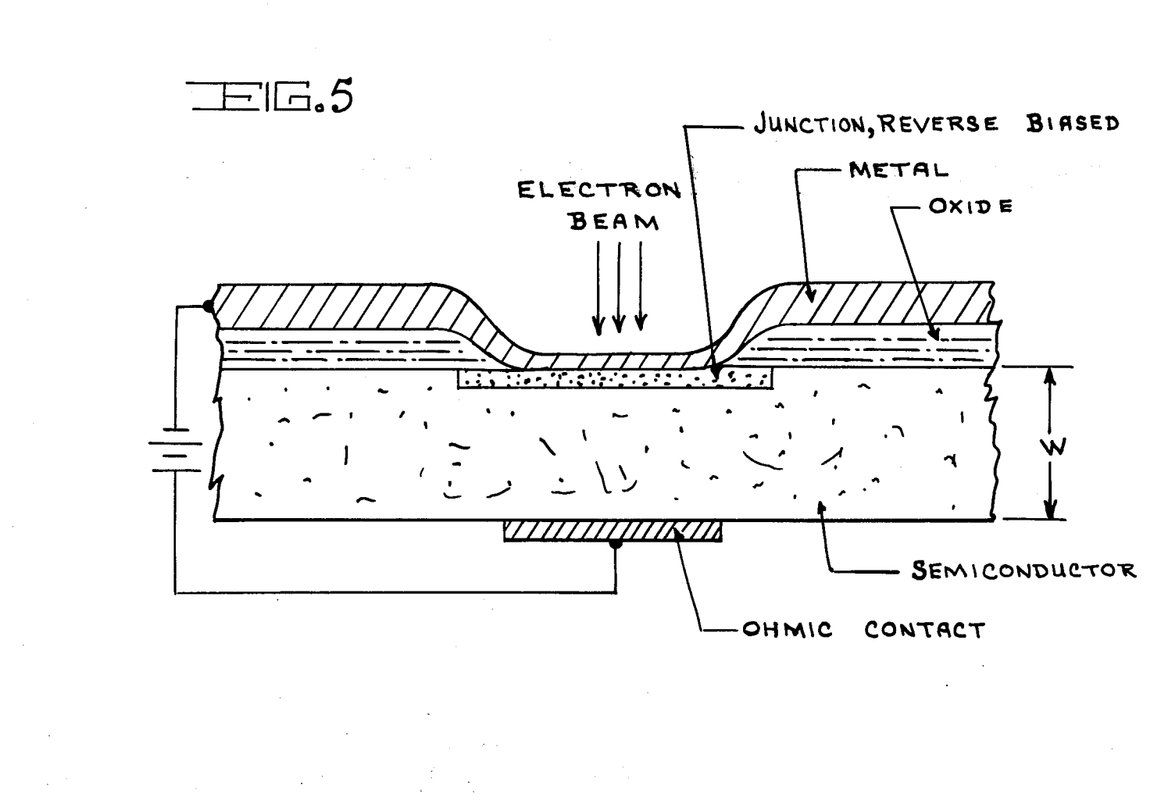
FIG. 5 shows one example of a semiconductor diode target utilized as an electron beam sensitive device.

The electron beam sensing device can be any device which is capable of detecting the presence of an electron beam and recovering at a rate equal to or faster than the period of beam rotation, $T_c = 2\pi/\omega_c$. One such device is a reverse-biased semiconductor diode. Such devices have been used by several researchers for electron beam activated switches, amplifiers, and samplers. (Several other structures could be used, including avalanche transistors and MOS devices). FIG. 5 is a cross section of such a target. It consists of a reverse biased semiconductor diode having a shallow junction. The structure is usually fabricated such that the depletion region extends through the epilayer close to the ohmic contact. Hence, there is a high field region between the junction and ohmic contact. In this high field region free charge is swept into the contacts at saturated drift velocities. An electron with energy $\varepsilon$ penetrating the metal contact just above the junction will give up a portion of its energy ($\epsilon$) to the metal film and the remainder to the semiconductor. If the ionization energy of the semiconductor is $\phi$, then ($\varepsilon - \epsilon)/\phi$ electron-hold pairs will be generated. One type of carrier will be swept across the high field region at saturated velocity, $v_s$. The other type will be collected at the top contact. If the high field region is of width $W$, a current pulse will flow in the external circuit during the time required for the drifting carriers to transit the diode, $\tau_2$. The transit time is given by $$\tau_2 = \frac{W}{v_s}. \quad (3)$$

Figure 6:
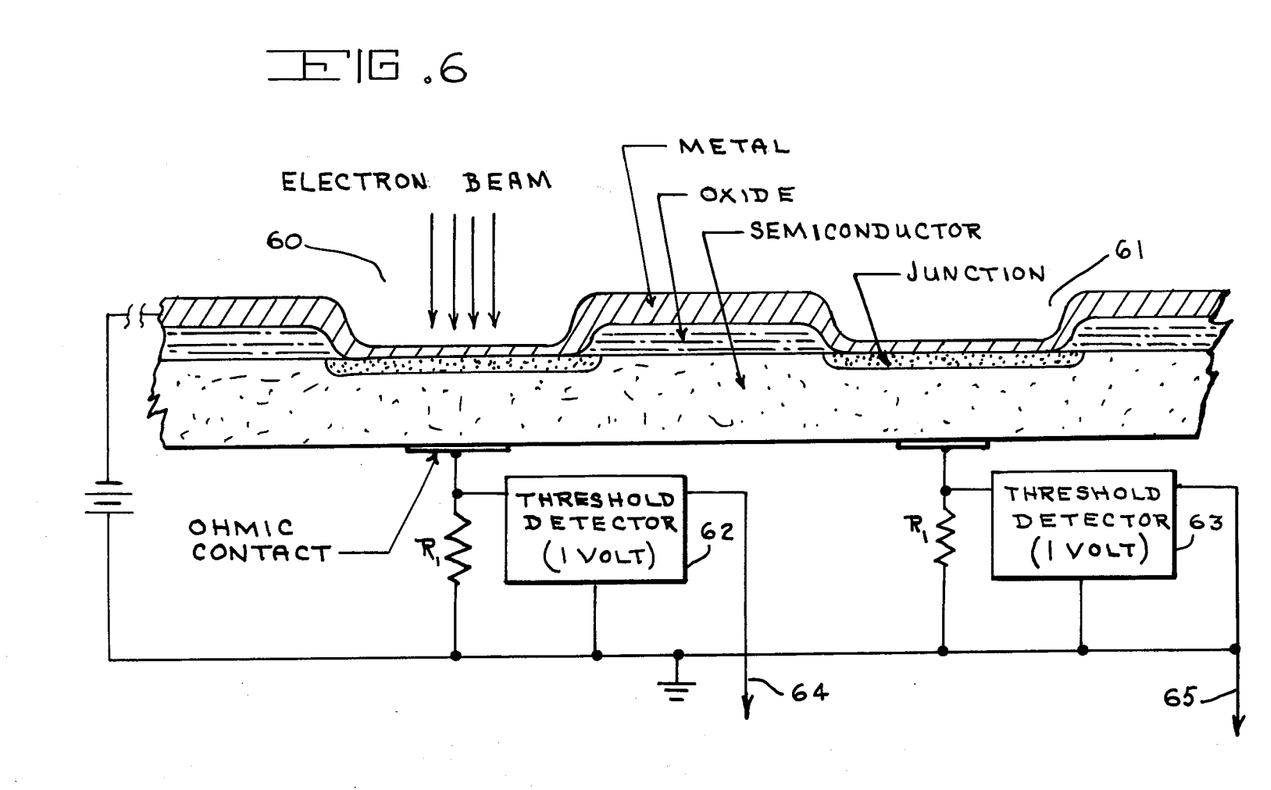
FIG. 6 illustrates two segments of a sector in the mosaic target.

The charge Q, generated in a sector composed of diodes, on a single pass of the electron beam is:

$$Q = \tau_1 I_b \frac{(\varepsilon - \epsilon)}{\phi} \quad (4)$$

where
- $\tau_1$ = time in seconds/sector
- $I_b$ = beam current
- $\varepsilon$ = electron energy
- $\epsilon$ = energy lost
- $\phi$ = ionization energy of semiconductor The resulting current pulse is of amplitude $Q/\tau_2$ and lasts for $\tau_2$ seconds. The electron beam encodes the information contained in the analog input signal onto the mosaic target, each sector corresponding to a specific time interval of the input signal and each segment corresponding to a finite range in amplitude of the analog input signal. The signal is thus quantized in time and amplitude. Since the sweep time (Equation 2) across a particular sector can be as short as a few picoseconds, a means of storing the target response (holding circuit) for a time compatible with state-of-the-art output and logic circuitry is required. There is a time constant associated with the response of most electron-sensitive devices. If the time constant can be made sufficiently long, no holding circuit will be required. It is necessary, however, for the time constant to be shorter than one period of revolution of the electron beam. For the electron-beam-sensitive semiconductor junction as previously discussed, the device response time is given by $W/v_s$. There is a practical limit on maximum $W$ of about $4 \times 10^{-2}$ cm, which corresponds to a response time in silicon of 4 nsec. This is sufficiently long for compatibility with state-of-the-art output circuitry. A cross section of a segment composed of diodes 60 and 61 is shown in FIG. 6. There is included threshold detectors 62 and 63 providing outputs 64 and 65, respectively.

Figure 7:
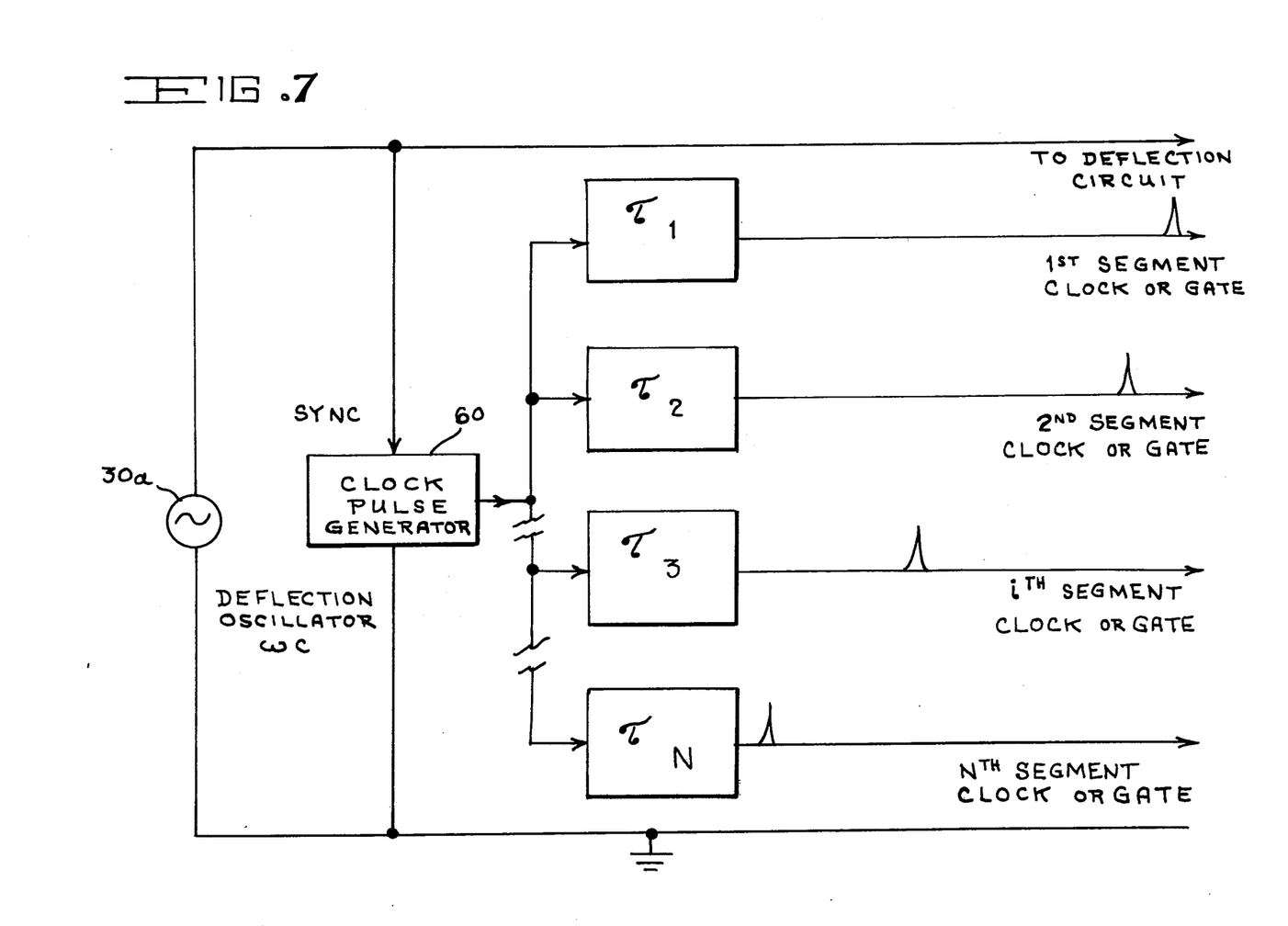
FIG. 7 shows a synchronous clock pulse circuit.

The digital output circuitry must be clocked in synchronism with the rotation of the electron beam. One of many ways this can be accomplished is shown in FIG. 7. Clock pulse generator 60 is excited by the deflection oscillator 30a. Clock pulses are fed through a network of delay lines $\tau_1$ to $\tau_N$ to the logic circuitry for each sector, where the delay for the $i^{th}$ sector is given by $$\tau_i = \frac{2\pi}{\omega_c} \cdot \frac{i}{N}.$$

Figure 8:
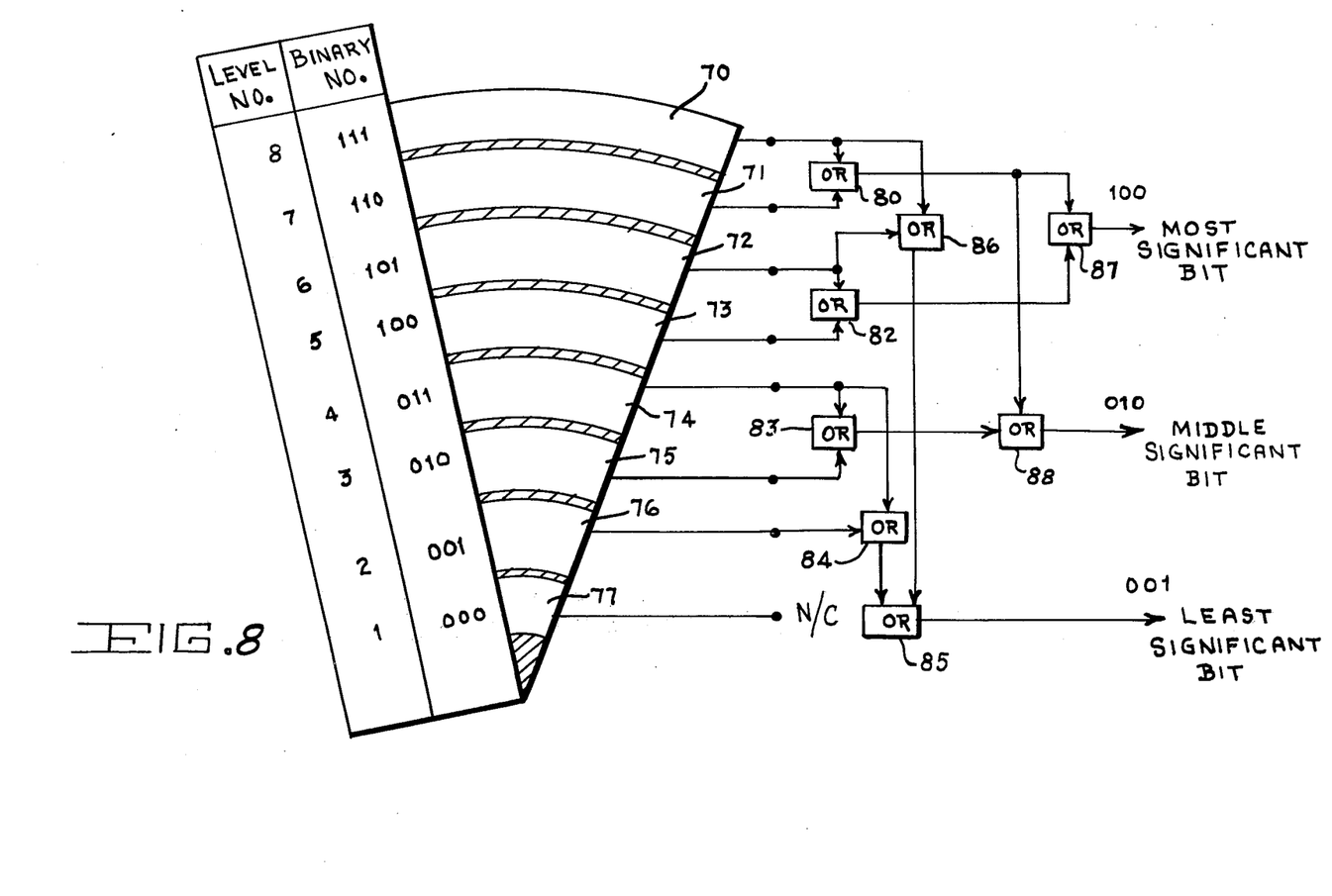
FIG. 8 shows a three bit encoder associated with the mosaic target and operating as the output circuitry.
Figure 9:
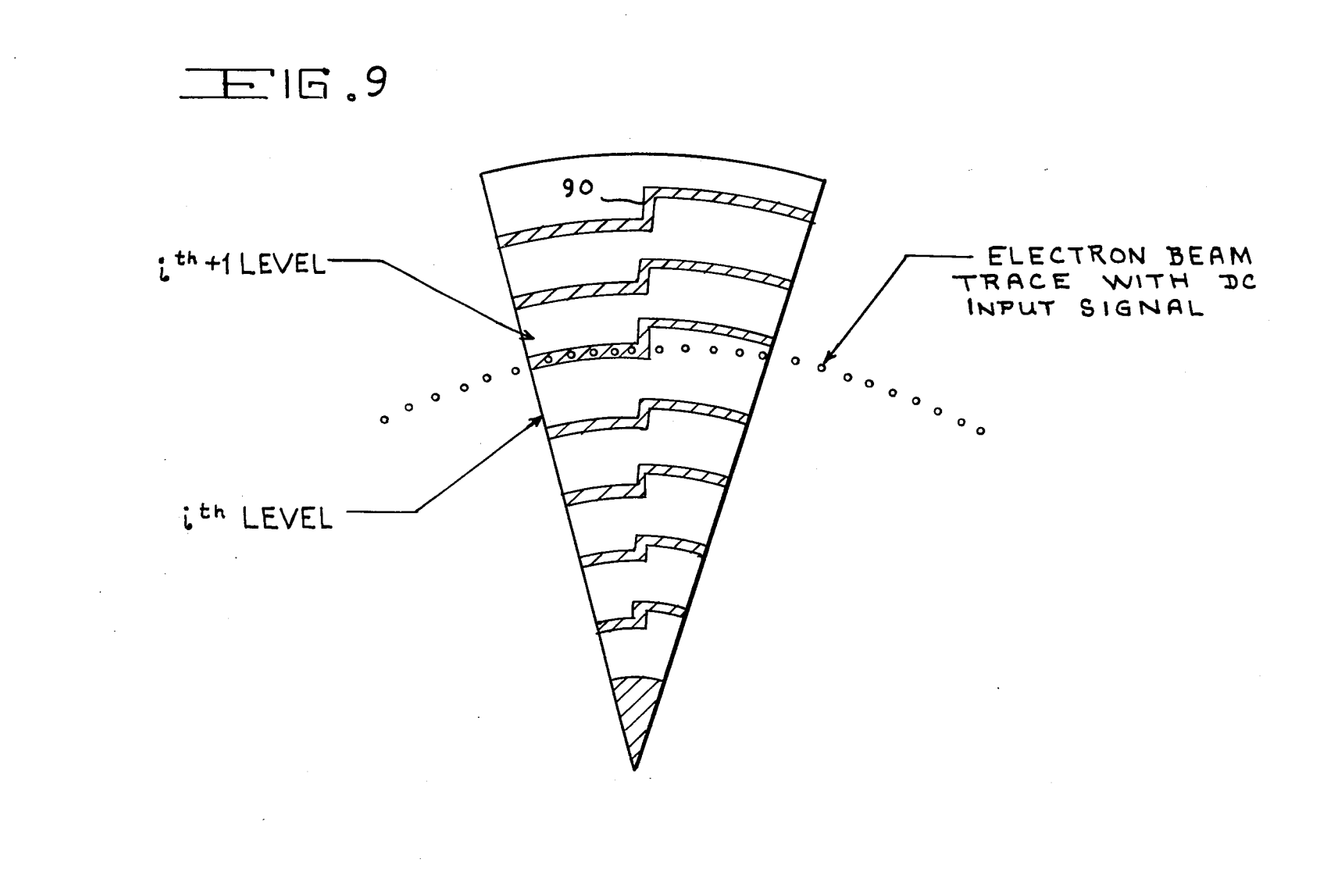
FIG. 9 shows one sector of the mosaic target with "gap filling"

To operate the device as an A/D converter, a binary encoder is required to encode the quantized amplitude to binary format. An example is shown in FIG. 8 for a three bit binary encoder. Here the only logic circuitry employed is the OR circuit. With this encoder the output will register the higher of any quantized level in the event that the electron beam scans across two adjacent levels. This may happen when the signal amplitude is changing rapidly and is near the division between two adjacent levels (segments). For example, segments 70 and 71 connect to OR 80, segments 72 and 73 to OR 82, segments 74 and 75 to OR 83, segments 74 and 76 to OR 84, OR 86 connects to segment 70 and segment 72, OR 85 connects to OR 84 and 86, OR 87 connects to OR 80 and 82, and OR 88 connects to OR 80 and 83. If the beam should scan along the divider between two adjacent levels the electron beam may miss both segments and hence the level will not register. To overcome this problem a technique called gap filling may be employed. Gap filling makes the boundary between two adjacent levels of the sector irregular. An example is shown in FIG. 9, where the boundary is stepped at midpoint 90 of the sector. Here, if a DC input signal is applied the electron beam trace on the target must illuminate at least one segment. In the event that both segments are illuminated (i.e., the $i^{th}$ and the $i^{th} = 1$) the encoder shown in FIG. 8 will automatically select the greater level. This gap filling technique also has the advantage that the spacing between two adjacent levels may be increased so that the stray coupling is reduced preventing signal coupling between adjacent levels.

Figure 10:
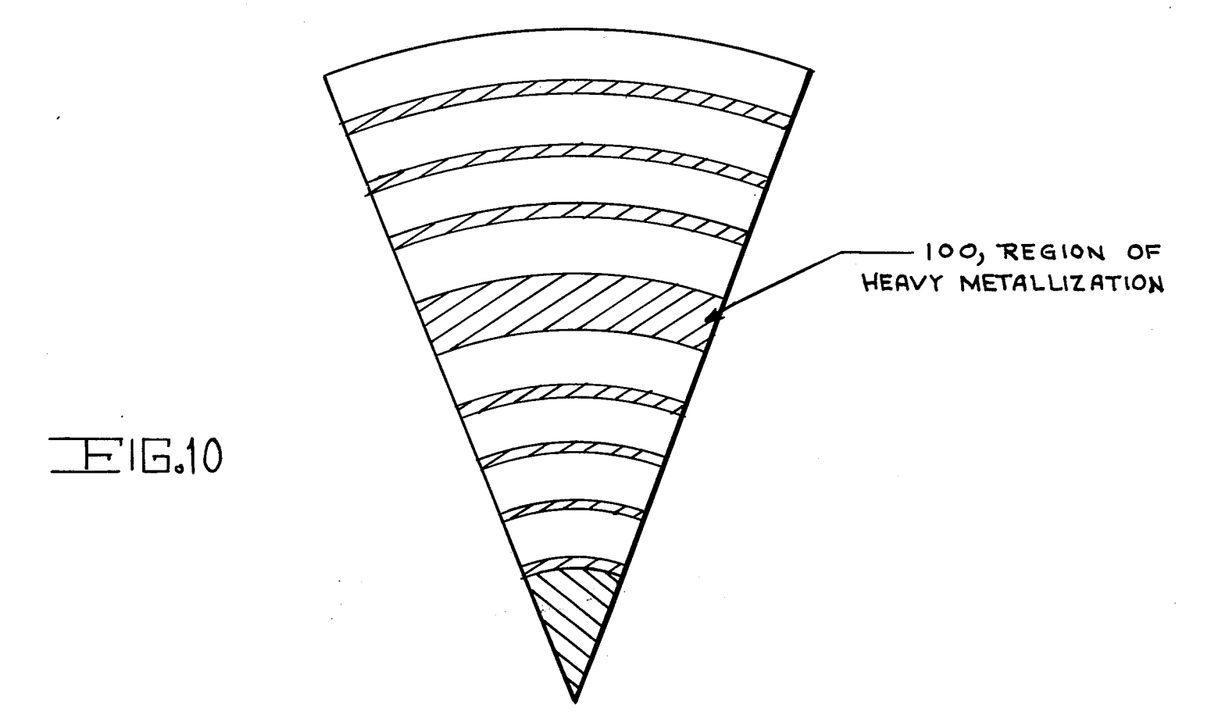
FIG. 10 shows a sector of a mosaic target with provision for bipolar signals.

A second technique for preventing the electron beam trace from falling between two levels (and not registering) is to simply make the electron beam diameter greater than the gap spacing of the adjacent levels. Here, if the electron beam is between two adjacent levels both levels will register an output and the logic circuit of the encoder will select the larger level (see FIG. 8). For bipolar signals an annular region of electron insensitive material can be placed in an appropriate region of each sector. This may be heavily metalized region 100 as shown in FIG. 10. With no input signal the deflection oscillator amplitude is adjusted such that the trace will be on the insensitive material.

Following is a target design for a 4-bit, 1 GHz Analog-to-digital converter using an N-type silicon semiconductor diode electron beam sensing element. No attempt will be made to optimize the design. It is intended to merely demonstrate feasibility.

A convenient deflection oscillator frequency is 200 MHz. From Equation 1, the number of sectors required for Nyquist sampling is 10.

There is usually desired a margin above the Nyquist criteria therefore there is chosen $N = 12$.

The number of segments required for a 4-bit A/D converter is $2^4 = 16$.

The maximum sector angle is $$\frac{2\pi}{N} = \left(\frac{1}{6}\right)\pi.$$

To allow spacing between sectors there is chosen the angle of the active area, $\theta$, equal to $(1/12)\pi$.

From Equation 2, the time required for the electron beam to traverse a sector, $\tau_1$, is $0.2 \times 10^{-9}$ seconds/sector.

There is chosen the recovery time $\tau_2$ of the semiconductor diode to be one-half of the period of the deflection oscillator, $\tau_2 = 0.25 \times 10^{-8}$ seconds.

The depletion region width corresponding to $\tau_2$, as given by Equation 3, is $W = 0.025$ centimeters.

For a silicon diode $N_D = 2 V_B/W^2$
$\epsilon =$ permitivity of silicon
$V_B =$ bias voltage, $s =$ electronic charge
$N_D =$ silicon doping density or $N_D 2.1 \times 10^{10} V_B$.
For $V_B = 1000$ volts, $N_D = 2 \times 10^{13}$.

The resulting electric field in the depletion region will be $4 \times 10^4$ volts/cm, which is adequate for the assumption of saturated drift velocities.

From Equation 4, the charge generated in each sector on one pass of the electron beam is $1/3 \times 10^{-9}$ coulombs. This assumes an 8 KeV beam with a current 1ƒ 1 milliampere and a contact metalization thickness of 2000 A which corresponds to a penetration energy loss of about 2 KeV. Also the ionization energy of silicon is about 3.6eV.

The current pulse output of each sector is $Q/\tau_2 = 0.133$ amperes.

The segment design makes use of the gap filling technique previously discussed and shown in FIG. 9. The spacing between segments is chosen to be one-half the length of a segment. The minimum charge generated in a given sector occurs when the beam sweeps between segments. In this situation the charge generated and resulting current is decreased by a factor of 2. Therefore the threshold detector must be designed to respond to this reduced current (FIG. 6). Choose $R_1$ in FIG. 6 to produce 1 volt in response to a current $$\left(\frac{1}{2}\right)\frac{Q}{\tau_2} = .066 \text{ amperes.}$$

The 1 volt is chosen as a typical threshold level,
$R = 1/.066 = 15.2\Omega$.

Since $\tau_2$ was chosen to be one half the period of the deflection oscillator the duty factor is 50 percent. Therefore the maximum power dissipated in $R_1$ is 0.3 watts. The power dissipated in the target is the beam power plus the device voltage $\times$ current $\times$ duty factor. The beam power is about 1/30 watts.

Device dissipation = 66 watts $\approx$ 70 watts. If a miximum device temperature of 200° C is allowed and assuming the total power/sector is dissipated in a single segment, the segment thermal resistance must be less than 2.5° C/W. This is well within the state-of-the-art.

Figure 11:
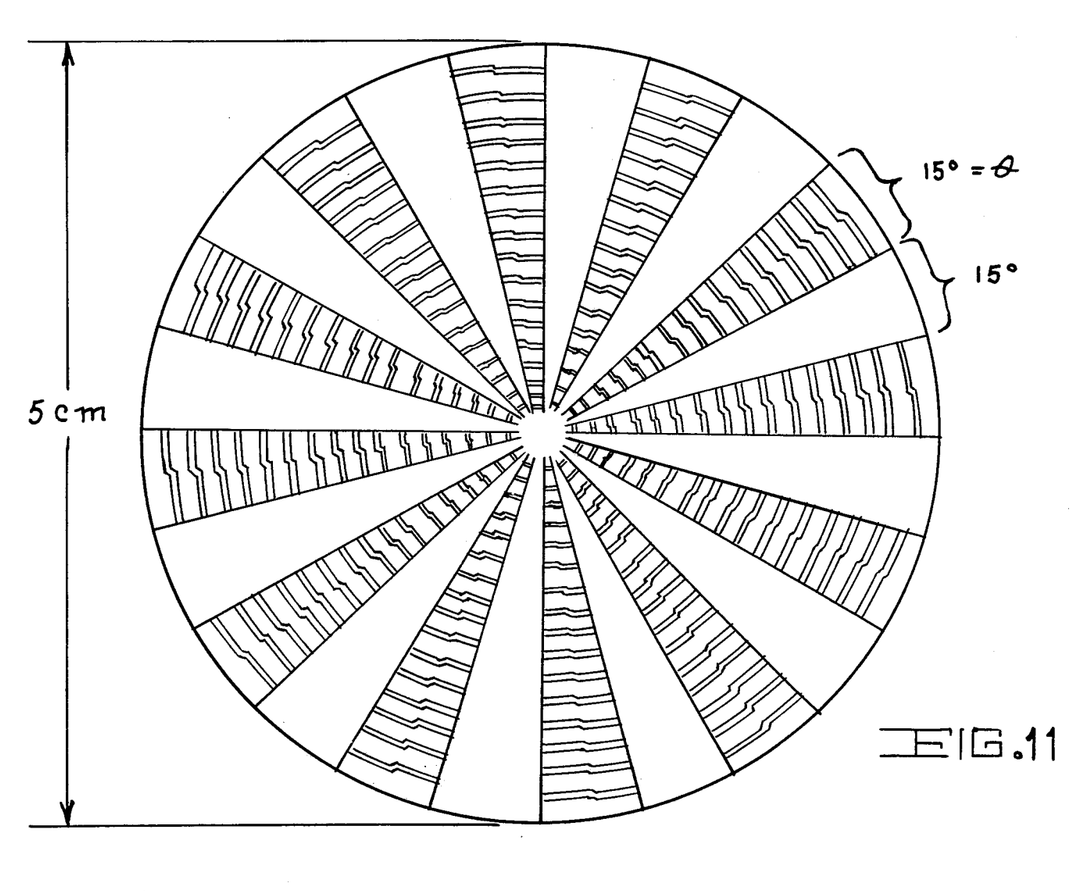
FIG. 11 illustates a design example of a mosaic target.

FIG. 11 is a sketch of the target layout designed. It is approximately 3.4 times.

What is claimed is:

1. A real time large data rate quantizer and analog-to-digital converter for an input analog wave form being comprised of an electron gun providing an electron beam of high constant energy, a mosaic target of electron beam sensitive detectors arranged in annular rings, said mosaic target having a preselected number of sectors, each sector being in the form of a wedge shaped piece, each sector including a preselected number of segments, each segment being a separate electron beam sensitive device, each sector corresponding to a specific time interval of said input analog signal and each segment corresponding to a finite range in amplitude of said input analog waveform, vertical and horizontal deflection circuitry means connected to said vertical and horizontal deflection structure, respectively, and operating in combination therewith to provide a rotating beam impinging in the form of a spot of preselected size on said mosaic target in a circular pattern, said vertical and horizontal circuitry means receiving said input analog waveform to provide an increasing diameter of said circular pattern in accordance with an increasing magnitude of said input analog waveform, said vertical and horizontal circuitry means including a power splitter receiving said input analog waveform and providing first and second split signals, a deflection oscillator, a quadrature coupler connected to said deflection oscillator and providing first and second oscillator deflection signals therefrom, first and second amplitude modulators, said first amplitude modulator receiving said first split signal and said first oscillator deflection signal, said second amplitude modulator receiving said second split signal and said second oscillator deflection signal, said first and second amplitude modulators providing first and second deflection signals to said vertical and horizontal deflection plates, respectively, and a vacuum envelope for said electron gun, said vertical and horizontal deflection structure and said mosaic target.

2. A real time large data rate quantizer as described in claim 1 wherein each of said electron beam sensitive detectors is comprised of a reverse-biased semiconductor diode.

3. A real time large data rate quantizer as described in claim 1 wherein the output signals from said mosaic target are fed to a binary encoder positioned in said vacuum envelope to provide a binary digital output waveform.

* * * * *